United States Patent
Kim et al.

(10) Patent No.: US 9,331,841 B2
(45) Date of Patent: May 3, 2016

(54) DATA SYNCHRONIZATION APPARATUS

(71) Applicant: KOREA RESEARCH INSTITUTE OF STANDARDS AND SCIENCE, Daejeon (KR)

(72) Inventors: Jin Mok Kim, Daejeon (KR); Hyukchan Kwon, Daejeon (KR); Yong Ho Lee, Daejeon (KR); Ki Woong Kim, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 132 days.

(21) Appl. No.: 14/045,939

(22) Filed: Oct. 4, 2013

(65) Prior Publication Data
US 2014/0348183 A1 Nov. 27, 2014

(30) Foreign Application Priority Data

May 21, 2013 (KR) ........................ 10-2013-0057277

(51) Int. Cl.
*H04L 7/00* (2006.01)
*H03M 9/00* (2006.01)

(52) U.S. Cl.
CPC ............ *H04L 7/0041* (2013.01); *H04L 7/0008* (2013.01); *H04L 7/0012* (2013.01); *H04L 7/0045* (2013.01); *H03M 9/00* (2013.01)

(58) Field of Classification Search
CPC ... H04L 7/0041; H04L 7/0045; H04L 7/0012; H04L 7/0008; H03M 9/00
USPC ............................. 375/354, 355, 503; 370/503
See application file for complete search history.

(56) References Cited

U.S. PATENT DOCUMENTS

| 5,550,874 | A  | * | 8/1996  | Lee ............................. 375/354 |
| 6,259,387 | B1 | * | 7/2001  | Fukazawa ................... 341/100 |
| 7,010,612 | B1 | * | 3/2006  | Si et al. ....................... 709/232 |
| 7,064,690 | B2 | * | 6/2006  | Fowler et al. ............... 341/101 |
| 8,498,540 | B2 |   | 7/2013  | Kim et al. |
| 2003/0016733 | A1 | * | 1/2003 | Cha ............................. 375/149 |
| 2004/0260961 | A1 | * | 12/2004 | Zhao et al. ................. 713/400 |
| 2005/0147178 | A1 | * | 7/2005 | Kikuchi ..................... 375/288 |
| 2012/0016612 | A1 |   | 1/2012 | Kim et al. |

FOREIGN PATENT DOCUMENTS

| DE | 19758825 B4   | 6/2010 |
| KR | 101998002165  | 6/1998 |
| KR | 101012107 B1  | 2/2011 |
| KR | 101050478 B1  | 7/2011 |
| KR | 102011013273  | 12/2011 |

* cited by examiner

Primary Examiner — Qutbuddin Ghulamali
(74) Attorney, Agent, or Firm — Harness, Dickey & Pierce, P.L.C.

(57) ABSTRACT

Provided is a data synchronization apparatus. The data synchronization apparatus includes a signal conversion block converting individual serial digital signals into parallel digital signals in response to a load signal and converting the parallel digital signals into synchronized serial digital signals in response to a synchronization load signal which does not overlap the load signal, a clock/load signal generator outputting a reference load signal for generating the synchronization load signal to the signal conversion block, a multiplexer multiplexing the synchronized serial digital signals, and a first serial-to-parallel (S/P) converting the multiplexed signal into parallel signals.

13 Claims, 8 Drawing Sheets

DATA SYNCHRONIZATION APPARATUS

CROSS-REFERENCE TO RELATED APPLICATIONS

This U.S. non-provisional patent application claims priority under 35 U.S.C. §119 of Korean Patent Application No. 10-2013-0057277, filed on May 21, 2013, the entire contents of which are hereby incorporated by reference.

BACKGROUND OF THE INVENTION

The present invention disclosed herein relates to a data processing system, and more particularly, to a data synchronization apparatus for preventing a plurality of individual serial data signals from being imperfectly converted into synchronized serial data signals.

Typically, sensors sensing biomedical signals in medical instruments become a plurality of data sources. These sensors include sensors measuring, for example, magnetocardiography (MCG), magnetoencephalography (MEG), electrocardiography (ECG), or electroencephalography (EEG). For example, as one of these sensors, there is a superconducting quantum interference device (SQUID) sensor.

Furthermore, a computer for processing digital signals generated by a plurality of data sources is required to synchronize the digital signals with each other. Since sensors for sensing biomedical signals may be used in plural, a plurality of data sources may form a single channel. When there are a plurality of these channels, a computer is required to synchronize digital signals received through the plurality of channels to process them.

For this, a data synchronization apparatus is used between the data sources and the computer. The data synchronization apparatus outputs synchronized serial digital signals through serial-to-parallel (S/P) conversion and parallel-to-serial (P/S) conversion for digital signals output from individual serial data sources. Currently, in the data synchronization apparatus, synchronization is not performed between load signals for operating an S/P converter and a P/S converter. That is, a load signal for operating the S/P converter and a load signal for operating the P/S converter may be generated in an overlapped type. Due to this, a plurality of individual serial digital data signals are imperfectly converted into synchronized digital data signals.

SUMMARY OF THE INVENTION

The present invention provides a data synchronization apparatus capable of preventing a plurality of individual serial data signals from being imperfectly converted into synchronized serial data signals.

Embodiments of the present invention provide data synchronization apparatuses including: a signal conversion block converting individual serial digital signals into parallel digital signals in response to a load signal and converting the parallel digital signals into synchronized serial digital signals in response to a synchronization load signal which does not overlap the load signal; a clock/load signal generator outputting a reference load signal for generating the synchronization load signal to the signal conversion block; a multiplexer multiplexing the synchronized serial digital signals; and a first serial-to-parallel (S/P) converting the multiplexed signal into parallel signals.

In some embodiments, the signal conversion block may include: a second S/P converter converting the individual serial digital signals into the parallel digital signals in response to the load signal; a synchronization load block generating the synchronization load signal which does not overlap the load signal in response to the reference load signal; a parallel-to-serial (P/S) converter converting the parallel digital signals into the synchronized digital signals in response to the synchronization load signal; and a switch block controlling an output of the P/S converter for compensating for data signals, which are not loaded as the synchronized serial digital signal by the P/S converter due to the generation of the synchronization load signal.

In other embodiments, the synchronization load block may include: a load signal processing block generating a first output signal for guaranteeing a minimum load time of the S/P converter on the basis of the load signal; and a synchronization load signal generating block blocking an operation of generating the synchronization load signal on the basis the synchronization load signal when the first output signal exist.

In still other embodiments, the load signal processing block may include: a first flip-flop receiving an ON voltage through an input terminal and generating the first output signal in response to the load signal which is input through a clock terminal; a first inverter inverting the first output signal; and a first delay delaying the inverted first output signal for a predetermined time to output the delayed result as a first delay signal to a clean terminal of the first flip-flop.

In even other embodiments, the load signal processing block may include: a first flip-flop receiving an ON voltage through an input terminal and generating the first output signal in response to the load signal which is input through a clock terminal; a first inverter inverting the first output signal; and a first delay delaying the inverted first output signal for a predetermined time to output the delayed result as a first delay signal to a clean terminal of the first flip-flop.

In yet other embodiments, the switch block may include: a first switch connected to a preset ON voltage and providing the ON voltage to an input of the P/S converter in response to a first switch control signal; a second switch connected to a preset OFF voltage and providing the OFF voltage to an input of the P/S converter in response to a second switch control signal; and a third switch connected to an output terminal of the P/S converter and providing previously output serial digital signals to an input of the P/S converter in response to a third switch control signal.

In still other embodiments of the present invention, data synchronization apparatuses including: a first S/P converter converting serial digital signals into parallel digital signals in response to a load signal; a synchronization load block generating a synchronization load signal which does not overlap the load signal on the basis of a reference load signal; a P/S converter converting the parallel digital signals into synchronized serial digital signals in response to the synchronization load signal; and a switch block controlling the P/S converter for compensating for data signals which are not loaded as serial digital signals by the P/S converter according to the generation of the synchronization load signal.

In some embodiments, the data synchronization apparatuses may further include: a multiplexer multiplexing the synchronized serial digital signals output from the P/S converter; and a second S/P converter converting the multiplexed signal into parallel digital signals.

In other embodiments, the data synchronization apparatus may further include a clock/load generator generating the reference load signal.

In still other embodiments, the synchronization load block may include: a load signal processing block generating a first output signal for guaranteeing a minimum load time of the first S/P converter on the basis of the load signal; and a synchronization load signal generating block blocking an operation of generating the synchronization load signal on the basis of the reference load signal, when the first output signal exists.

In even other embodiments, the load signal processing block may include: a first flip-flop receiving an ON voltage through an input terminal and generating the first output signal in response to the load signal which is input through a clock terminal; a first inverter inverting the first output signal; and a first delay delaying the inverted first output signal for the minimum load time to output the delayed result as a first delay signal to a clean terminal of the first flip-flop.

In even other embodiments, the synchronization load signal generating block may include: a second flip-flop receiving an ON voltage through an input terminal and generating a second output signal in response to the reference load signal through a clock terminal; a second delay delaying the second output signal for the minimum load time of the P/S converter to output the delayed second output signal as a second delay signal; a first OR gate performing a logical sum on the first output signal and the second delay signal; a second inverter inverting an output of the first OR gate to output the inverted result to a clean terminal of the second flip-flop; a third inverter inverting the second output signal; a third flip-flop receiving an ON voltage through an input terminal and generating a third output signal in response to the inverted signal by the inverter through a clock terminal; a second delay delaying the third output signal for the predetermined load time of the P/S converter to output the delayed third output signal as a third delay signal; a second OR gate performing a logical sum on the first output signal and the third delay signal; a fourth inverter inverting an output of the second OR gate to output the inverted result to a clean terminal of the second flip-flop; and a fifth inverter inverting the third output signal to generate the synchronization load signal.

In even still other embodiments, the switch block may include at least one of: a first switch connected to a preset ON voltage and providing the ON voltage to an input of the P/S converter in response to a first switch control signal; a second switch connected to a preset OFF voltage and providing the OFF voltage to an input of the P/S converter in response to a second switch control signal; and a third switch connected to the P/S converter and providing previously output serial digital signals to an input of the P/S converter in response to a third switch control signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
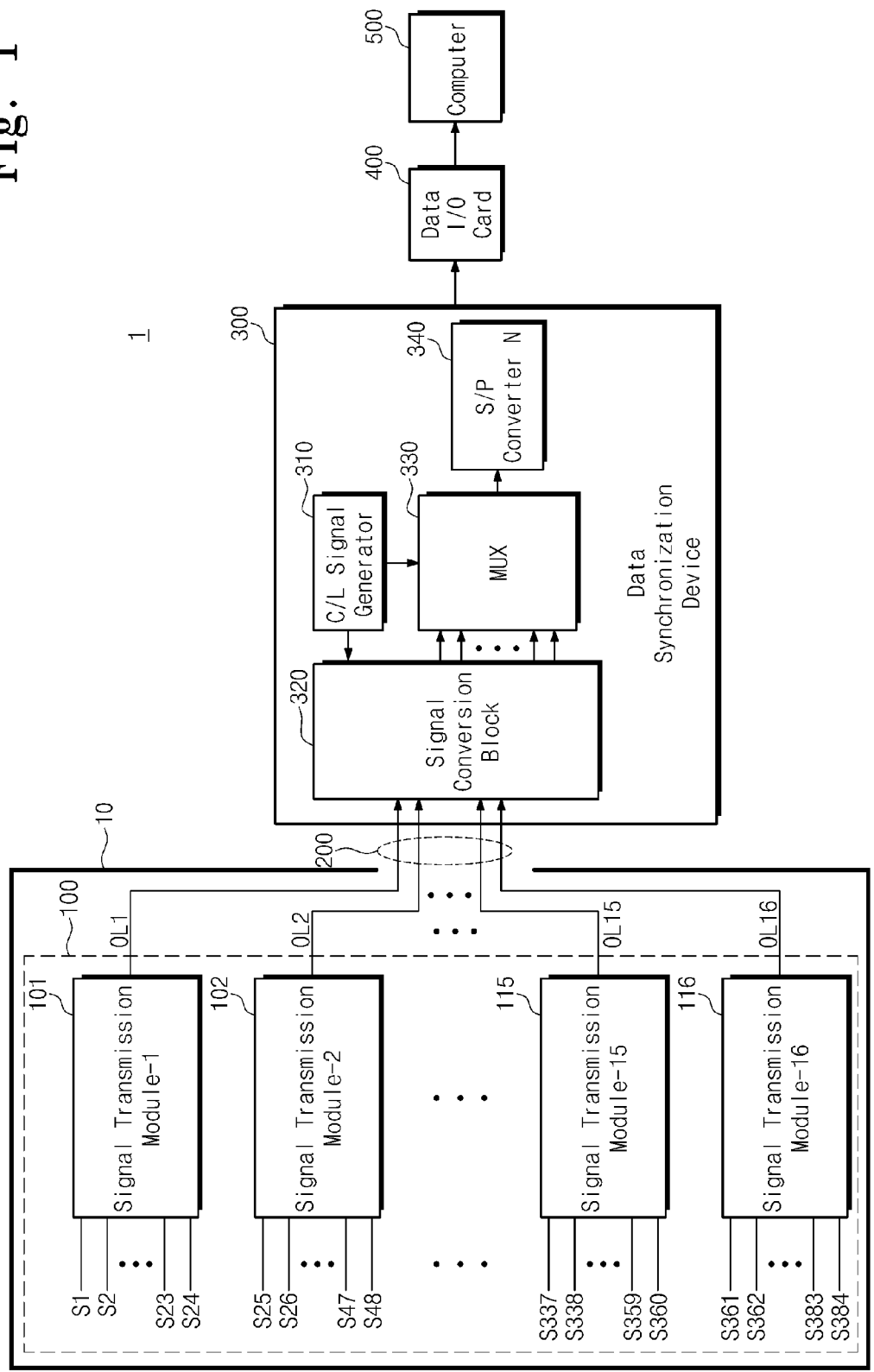
FIG. 1 illustrates an exemplary data processing system according to the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Also, any description that may unnecessarily blur the point of the present invention is omitted from the detailed description. Like reference numerals refer to like elements throughout.

The present invention provides a data synchronization apparatus for preventing individual serial digital signals from being imperfectly converted into synchronized serial data signals. The data synchronization apparatus proposed in the present invention may be applied to various fields, and, as an example, may be applied to medical diagnosis by using output signals from a plurality of superconducting quantum interference device (SQUID) sensors, which sense biomedical signals.

FIG. 1 illustrates an exemplary data processing system according to the present invention.

Referring to FIG. 1, the data processing system 1 includes a signal transmitting block 100, an optical cable 200, a data synchronization device 300, a data input/output (I/O) card 400, and a computer 500.

The signal transmitting block 100 may include, for example, 16 channels, namely, 16 signal transmitting modules 110 to 116.

The signal transmitting modules 101 to 116 may be connected to a plurality of sensors. Here, the sensors may be, as an example, SQUID sensors.

The signal transmitting modules 101 to 116 are respectively illustrated to receive signals through 24 sensors, as an example, but the sensors connected to each of the signal transmitting modules 101 to 116 may be varied in the number and type.

For example, a first signal transmitting module 101 receives 24 signals from 24 sensors S1 to S24. It is assumed that the rest of the signal transmitting modules receive 24 signals from 24 sensors.

The signal transmitting modules 101 to 116 converts the signals received through the sensors into optical signals, and transmits the optical signals to the data synchronization device 300 through the optical cable 200.

Furthermore, the signal transmitting block 100 and the sensors may be located within a shielded room 10.

The shielded room 10 provides a space in which magnetocardiography (MCG), magnetoencephalography (MEG), electrocardiography (ECG), or electroencephalography (EEG) is stably measured from a measuring target (for example, a human body) through SQUID sensors in the signal transmitting block 100. The shielded room 10 may be a magnetically shielded room (MSR), or a radio-frequency shielded room (RFSR).

The optical cable 200 connects the signal transmitting block 100 and the data synchronization device 300. The optical cable 200 includes a plurality of optical lines (OL).

The data synchronization device 300 includes a clock/road (C/L) signal generator 310, a signal conversion block 320, a multiplexer 330, and a serial-to-parallel (S/P) converter N 340.

The C/L signal generator 310 generates a clock signal and a reference load signal for operating the data synchronization device 300. The C/L signal generator 310 may output a clock signal to the signal conversion block 320 and the multiplexer 330. The C/L signal generator 310 provides the reference load signal to the signal conversion block 320.

The signal conversion block 320 receives individual serial digital signals corresponding to the signal transmitting modules 101 to 116. The signal conversion block 320 converts the individual serial digital signals into parallel signals, and converts the parallel digital signals into synchronized serial digital signals. During conversion into the synchronized serial digital signals, the signal conversion block 320 generates a synchronization load signal on the basis of the reference load signal generated in the C/L signal generator 310. The signal conversion block 320 converts the parallel digital signals into synchronized serial digital signals on the basis of the synchronization load signal. The signal conversion block 320 outputs the synchronized serial digital signals to the multiplexer 330.

The multiplexer 330 multiplexes the synchronized serial digital signals into a single serial digital signal to output the multiplexed result to the S/P converter N 340.

The S/P converter N 340 converts the multiplexed serial digital signal into parallel digital signals to output the parallel digital signals to the data I/O card 400.

The data I/O card 400 is connected to the computer 500, and controls data input and output of the computer 500 through a data I/O control of a signal. The data I/O card 400 may be also included in the computer 500.

The computer 500 classifies parallel digital signals received through the data I/O card 400 according to the signal transmitting modules to extract an MEG/MCG signal and an EEG/ECG signal. Also, the computer 500 may analyze the collected MEG/MCG and EEG/ECG signals, or output them to a display device.

The signal conversion block 320 proposed in the present invention generates a synchronization load signal on the basis of the reference load signal generated therein. Here, the synchronization load signal is generated in order not to overlap the individual load signal transmitted from each of the signal transmitting modules 101 to 116. Here, the individual load signals are used for conversion of the individual serial digital signals to the parallel digital signals.

Accordingly, the signal conversion block 320 generates the synchronization load signal, which does not overlap the individual load signals generated by the signal transmission modules 101 to 116, and thus prevents imperfect data conversion of S/P conversion and P/S conversion.

In addition, the signal conversion block 320 controls to output compensation serial digital signals capable of compensating for digital signals which are not P/S-converted according to the generation of the synchronization load signal.

Figure 2:
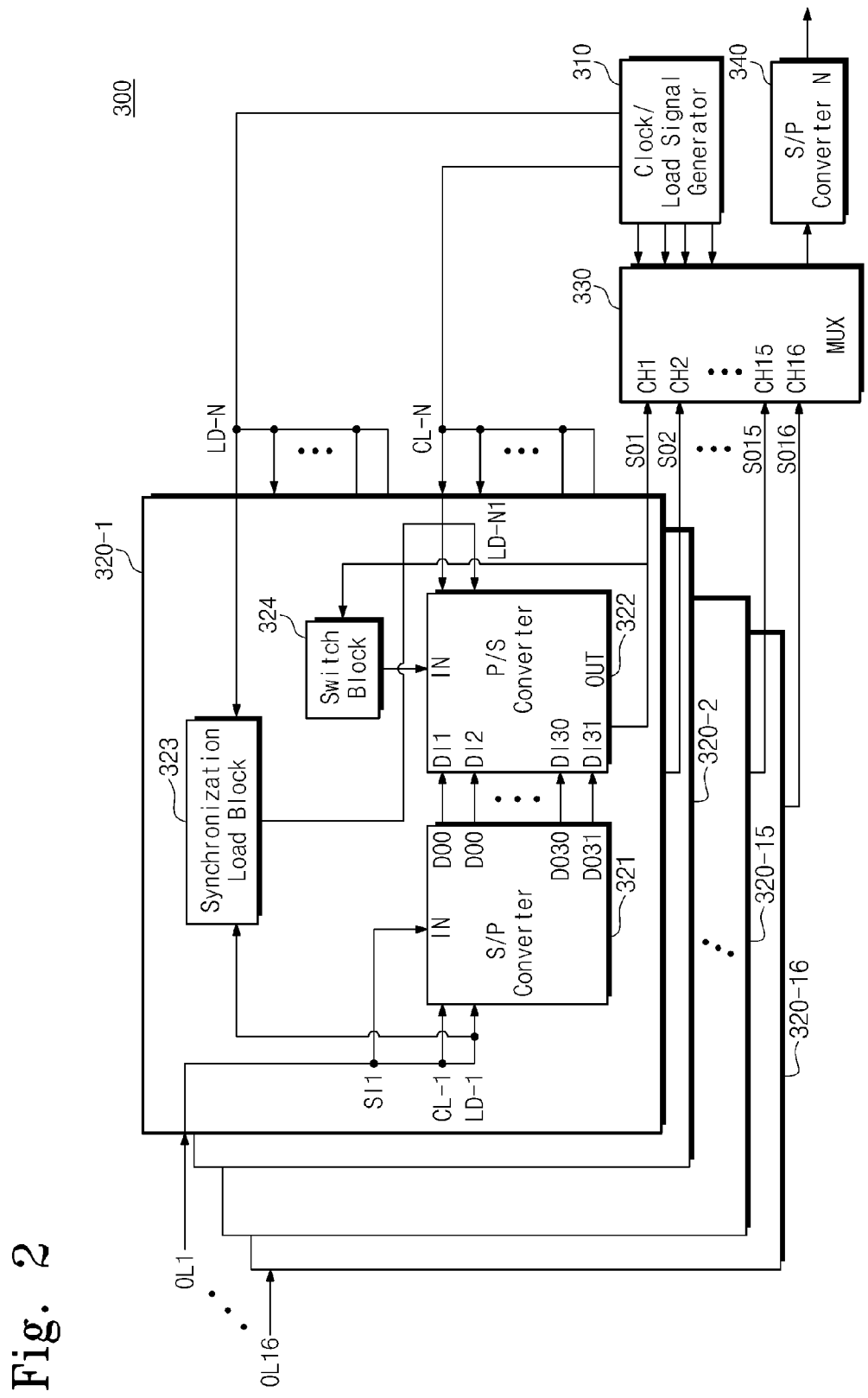
FIG. 2 illustrates a data synchronization apparatus according to the present invention.

FIG. 2 illustrates an exemplary data synchronization device 300 according to the present invention.

Referring to FIG. 2, the data synchronization device 300 includes the C/L signal generator 310, the signal conversion block 320, the multiplexer 330, and the S/P converter N 340.

The C/L signal generator 310 generates a clock signal CL-N and a reference load signal LD-N. The C/L signal generator 310 may include a counter therein for generating the reference load signal LD-N. The C/L signal generator 310 outputs the generated clock signal to the signal conversion block 320 and the multiplexer 330. Also, the C/L signal generator 310 outputs the reference load signal to the signal conversion block 320.

The signal conversion block 320 includes signal conversion modules 320-1, 320-2, . . . , and 320-16. Here, the number of the signal conversion modules 320-1, 320-2, . . . , and 320-16 may be the same as that of the signal transmitting modules 101 to 116.

For example, the signal conversion module 320-1 includes an S/P converter 321, a P/S converter 322, a synchronization load block 323, and a switch block 324.

The S/P converter 321 receives a serial digital signal SI1, a clock signal CL-1, and a load signal LD-1, generated in the first signal transmitting module 101. The S/P converter 321 is connected to the first signal transmitting block 101 through a first optical line OL1, and receives the serial digital signal SI1, the clock signal CL-1, and the load signal LD-1 through the first optical line OL1. For this, the first signal transmitting module 101 generates the independent clock signal CL-1 and load signal LD-1 therein.

The S/P converter 321 converts the serial digital signal SI1 to parallel digital signals in response to the load signal LD-1. The S/P converter 321 outputs the converted parallel digital signals to the P/S converter 322.

The P/S converter 322 receives the parallel digital signals, a reference clock signal CL-N, and a synchronization load signal LD-N1. The P/S converter 322 converts the received parallel digital signals into a synchronized serial digital signal S01 to output it to the multiplexer 330.

Here, the S/P converter 321 is a 32-bit S/P converter for processing the serial digital signal SI1 of 32 bits, and the P/S converter 322 is a 32-bit P/S converter. Accordingly, the serial digital signal that the S/P converter 321 receives from the first optical line OL1 is a 32-bit serial digital signal. As an example, a 32-bit serial digital signal may include an 8-bit address signal and a 24-bit (resolution) sensor signal.

However, the S/P converter 321 and the P/S converter 322 may respectively adopt a 24-bit S/P converter (as an example, an S/P converter using a 24-bit serial digital signal including an 8-bit address signal and a 16-bit sensor signal) and a 24-bit P/S converter, and adopt an S/P converter and a P/S converter capable of processing digital signals having the various number of bits as well as 24 bits or 32 bits.

The synchronization load block 323 receives the load signal LD-1 and the reference load signal LD-N. The synchronization load block 323 guarantees the minimum time duration required by the load signal LD-1. Also the synchronization load block 323 generates the synchronization load signal LD-N1, which does not collide with the load signal LD-1. The synchronization load block 323 outputs the synchronization load signal LD-N1 to the P/S converter 322. That is, when conversion into the parallel digital signals is performed by the S/P converter 321, the synchronization load block 323 outputs the synchronization load signal LD-N1 controlled in order not to output imperfect parallel digital signals from the S/P converter 321 to the P/S converter 322.

Moreover, the reference clock signal CL-N and the synchronization load signal LD-N1 are N-times faster than the clock signal CL-1 and the load signal LD-1 to allow the P/S converter 322 to repetitively output the synchronized serial digital signals SO1 N times until a next serial digital data signal SI1 is input after the serial digital data signal SI1 has been input.

The switch block 324 controls an output of the P/S converter 321 to compensate for data signals which are not loaded as a serial digital signal by the P/S converter 322 according to the generation of the synchronization load signal LD-N1. That is, even though the reference load signal LD-N is generated, the synchronization load block 323 may not transmit the synchronization load signal LD-N1 corresponding to the reference load signal LD-N to the switch block 324. At this time, the switch block 324 may output a preset value (for example, a high signal (5V) or a low signal (0V)) to the P/S converter 322. Alternately, the switch block 324 re-inputs the synchronized serial digital signal SO1 previously output from the P/S converter 322 to the P/S converter 322.

Like the signal conversion module 320-1, rest of the signal conversion modules 320-2, . . . , and 320-16 respectively include an S/P converter, a P/S converter, a synchronization load block, and a switch block, and their detailed operation can be referred to the description regarding the signal conversion module 320-1.

Accordingly, the signal conversion modules 320-2, . . . , and 320-16 generate synchronization load signals LD-N2, . . . , and LD-N16 on the basis of the load signals LD-2, . . . , and LD-16 and the reference load signal LD-N generated respectively by the signal transmitting modules 102, . . . , and 116.

The multiplexer 330 receives the synchronized serial digital signals from the respective signal conversion modules 320-1, 320-2, . . . , and 320-16. The multiplexer 330 sequentially selects the N (for example, 16) synchronized serial digital signals one by one to allow one digital signal to be output from each of the optical lines OL1 to OL 16. In this way, the multiplexer 300 transmits the synchronized serial digital signals from all the optical lines OL1 to OL16.

The S/P converter N 340 receives the synchronized serial digital signal output from the multiplexer 330. The S/P converter N 340 converts the synchronized serial digital data into parallel signals to output the parallel signals to the data I/O card 400.

In this way, the present invention prevents imperfect conversion of data due to collision between the load signals LD-1, LD-2, . . . , and LD-16 input from the signal transmitting modules 101 to 116 and the reference load signal LD-N.

Figure 3:
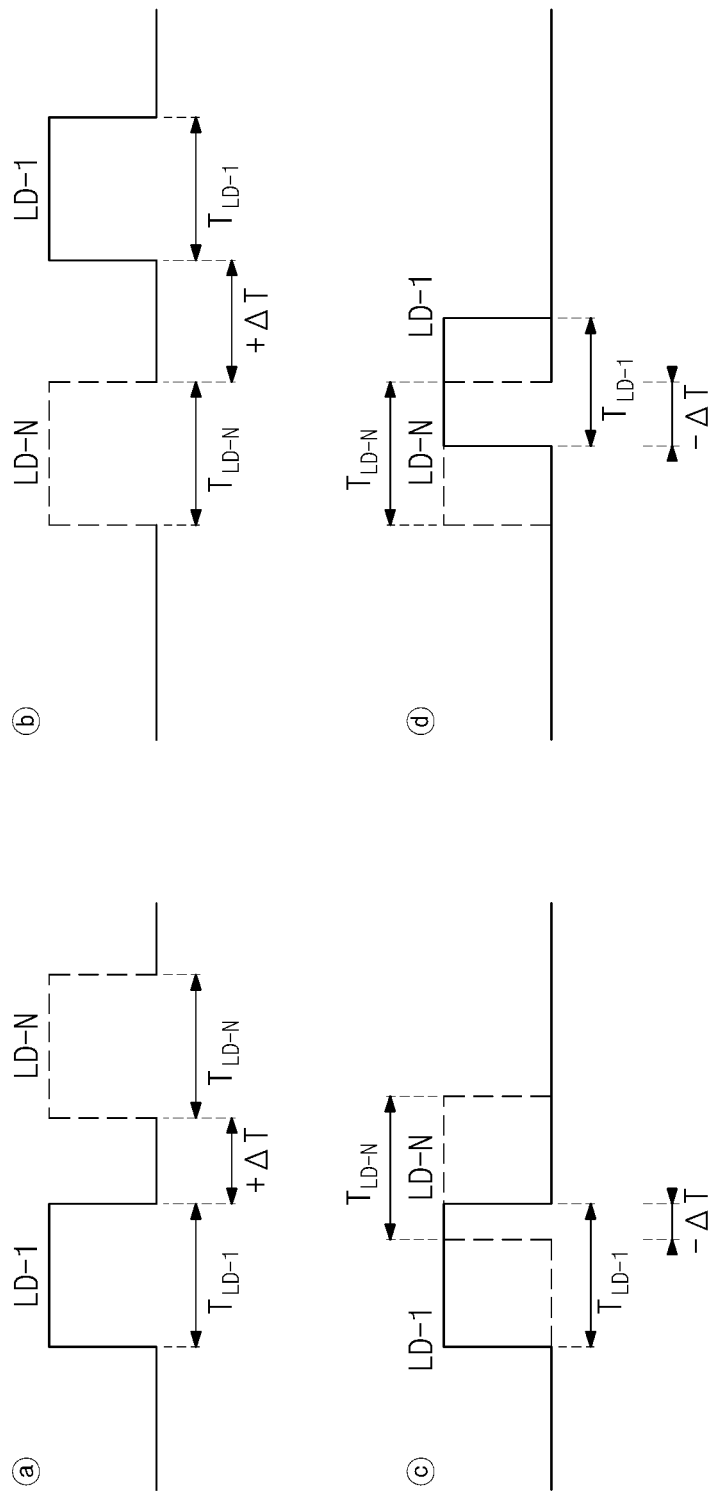
FIG. 3 illustrates a relationship between a load signal and a reference load signal.

FIG. 3 illustrates a relationship between the load signal and the reference load signal.

In FIG. 3, the load signal LD-1 and the reference load signal LD-N are illustrated. Here, a pulse width $T_{LD-1}$ of the load signal $T_{LD-1}$ is shown and the pulse width $T_{LD-1}$ is the minimum time for loading a serial signal as parallel signals. Also, a pulse width $T_{LD-N}$ of the reference load signal LD-N is shown and the pulse width $T_{LD-N}$ is the minimum time for loading parallel signals as a serial signal. The minimum time may be determined according to a speed of the digital device, and is from several ns to tens of ns.

For example, a case is considered that the S/P converter 321 performs S/P conversion by using the load signal LD-1, and the P/S converter 322 performs P/S conversion by using the reference load signal LD-N.

In FIG. 3(a), the load signal LD-1 is generated prior to the reference load signal LD-N, and there is a time interval+ΔT between the load signal LD-1 and the reference load signal LD-N. Namely, the load signal LD-1 and the reference load signal LD-N do not overlap each other.

In FIG. 3(b), the reference load signal LD-N is generated prior to the load signal LD-1, and there is a time interval+ΔT between the load signal LD-1 and the reference load signal LD-N. Namely, the load signal LD-1 and the reference load signal LD-N do not overlap each other.

In this way, the time interval+ΔT indicates that the load signal LD-1 and the reference load signal LD-N do not overlap each other.

However, the load signal LD-1 generated by the signal transmitting module 101, and the reference load signal LD-N generated by the data synchronization device 300 are not synchronized with each other. Due to this, when the number of times of data transmission increases, the load signal LD-1 and the reference load signal LD-N overlap each other.

In FIG. 3(c), even though the load signal LD-1 is generated prior to the reference load signal LD-N, there is a time interval−ΔT between the load signal LD-1 and the reference load signal LD-N. Namely, the load signal LD-1 and the reference load signal LD-N overlap each other.

In FIG. 3(d), even though the reference load signal LD-N is generated prior to the load signal LD-1, there is a time interval−ΔT between the load signal LD-1 and the reference load signal LD-N. Namely, the load signal LD-1 and the reference load signal LD-N overlap each other.

In this way, the time interval−ΔT indicates that the load signal LD-1 and the reference load signal LD-N overlap each other.

If the load signal LD-1 and the reference load signal LD-N as shown in FIGS. 3(a) and 3(b) are used, the imperfect conversion of digital signals does not occur in the S/P converter 321 and the P/S converter 322.

However, in FIG. 3(c), the P/S converter 322 becomes to operate with the reference load signal LD-N, while the S/P converter 321 having received the load signal LD-1 does not completely convert a serial digital signal into parallel signals. Thus, the P/S converter 322 transmits some of the entire data or wrong data.

In addition, in FIG. 3(d), the S/P converter 321 becomes to operate with the load signal LD-1, while the P/S converter 322 having received the reference load signal LD-N does not completely receive parallel digital signals. Thus, the P/S converter 322 receives parallel digital data mixed with previous data or wrong data.

In this way, if the load signal LD-1 and the reference load signal LD-N as shown in FIGS. 3(c) and 3(d) are used, imperfect conversions of the digital signals occur in the S/P converter 321 and the P/S converter 322. Accordingly, the computer 500 having received the digital signals that imperfect conversion occurs therein becomes to analyze wrong data. Also, software may be configured to correct errors for the wrong data inside the computer 500, but data processing operations by using the software need time to process data. Therefore, real-time processing is difficult and burdensome for data processing.

In order to address this limitation, the data synchronization device 300 of the present invention includes a synchronization load block 323 therein for generating the synchronization load signal LD-N1 which does not overlap the load signal LD-1. Also, the P/S converter 322 performs P/S conversion by using the synchronization load signal LD-N1 instead of the reference load signal LD-N.

Figure 4:
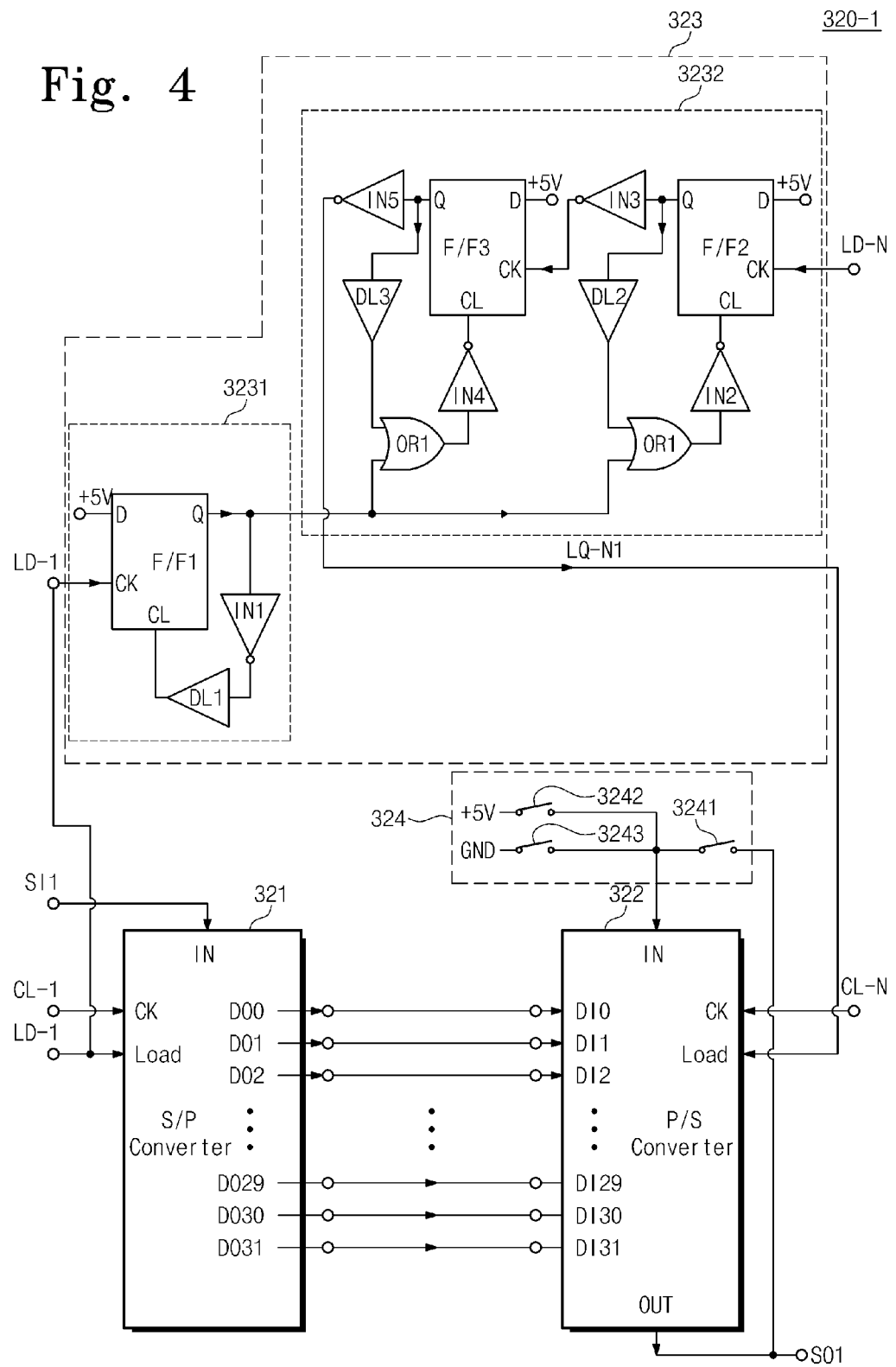
FIG. 4 illustrates a detailed exemplary structure of a signal conversion module according to the present invention.

FIG. 4 illustrates an exemplary detailed structure of the signal conversion module 320-1 according to the present invention.

Referring to FIG. 4, the signal conversion module 320-1 includes the S/P converter 321, the P/S converter 322, the synchronization load block 323, and the switch block 324.

The P/S converter 321 includes 32-bit output terminals DO0, . . . , and DO31, and the P/S converter 322 includes input terminals DI0, . . . , and DI31 corresponding to a 32-bit input.

Here, the synchronization load block 323 includes a load signal processing block 3231 and the synchronization load signal generator 3232.

The load signal processing block 3231 includes a first flip-flop F/F1, a first inverter IN1, and a first delay DL1.

The first flip-flop F/F1 receives an ON voltage (as an example, 5V) through an input terminal D and a load signal LD-1 through a clock terminal CK. Also, through an output terminal Q of the first flip-flop F/F1, a signal is output to the first inverter IN1. A clear terminal of the first flip-flop F/F1 is connected to the first delay DL1.

The first inverter IN1 inverts the signal input from the output terminal Q of the first flip-flop F/F1 to output the inverted result to the first delay DL1.

The first DL1 delays an output signal of the first inverter IN1, and may have a plurality of NOT gates or buffer gates serially connected. Here, the time delay is adjusted to guarantee the minimum load time $T_{LD-1}$ of the S/P converter 321. The first delay DL1 may control a clean state of the first flip-flop F/F1 by using the delayed signal.

Operation of the load signal processing block 3231 will be described.

When the load signal LD-1 is input (converted from an OFF voltage into an ON voltage) to the clock terminal of the first flip-flop F/F1, the ON voltage is output to the output terminal Q. However, the ON voltage is inverted to an OFF voltage by the first inverter IN1, delayed for a delay time $T_{LD-1}$ set by the first delay DL1, and input to the clear terminal CL to allow the operation of the first flip-flop F/F1 to be a clean state.

Through this process, the load signal processing block 3231 outputs an adjustment load signal, which is adjusted to guarantee the minimum load time of the S/P converter 321 due to a load signal, to the synchronization load signal generator 3232.

The synchronization load signal generator 3232 generates the synchronization load signal LD-N for preventing an imperfect parallel data signals from being converted into synchronized serial signals.

The synchronization load signal generator 3232 includes a second flip-flop F/F2, the second delay DL2, a first OR gate OR1, a second inverter IN2, a third inverter IN3, a third flip-flop F/F3, a third delay DL3, a second OR gate OR2, a fourth inverter IN4, and a fifth inverter IN5.

The second flip-flop F/F2 receives an ON voltage (as an example, 5V) through an input terminal D, and the reference load signal LD-N through the clock terminal CK. Also, a signal is output through an output terminal Q of the second flip-flop F/F2 to the second delay DL2 and the third inverter IN3. The clear terminal CL of the second first flip-flop F/F2 is connected to an output terminal of the second inverter IN2.

The second delay DL2 delays an output signal from the output terminal Q of the second flip-flop F/F2, and has a plurality of NOT gates or buffer gates serially connected. Here, the time delay is adjusted to guarantee the minimum load time $T_{LD-N}$ of the P/S converter 322.

The first OR gate OR1 performs a logical sum of an output of the second delay DL2 and an output of the second flip-flop F/F2 to output it to the second inverter IN2.

The second inverter IN2 inverts an output of the first OR gate OR1 to control a clean state of the second flip-flop F/F2.

The third inverter IN3 inverts an output signal from an output terminal Q of the second flip-flop F/F2 to output it to a clock terminal CK of the third flip-flop F/F3.

The third flip-flop F/F3 receives an ON voltage through an input terminal D and an output signal of the second inverter IN2 through a clock terminal CK. Also, a signal is output through the output terminal Q of the third flip-flop F/F3 to the third delay DL3 and the fifth inverter IN5. The clear terminal CL of the third flip-flop F/F3 is connected to an output terminal of the fourth inverter IN4.

The third delay DL3 delays an output signal from the output terminal of the flip-flop F/F3, and has a plurality of NOT gates or buffer gates serially connected. Here, the time delay is adjusted to guarantee the minimum load time $T_{LD-N}$ of the P/S converter 322.

The second OR gate OR2 performs a logical sum of an output of the third delay D13 and an output of the third flip-flop F/F3 to output it to the fourth inverter IN4.

The fourth inverter IN4 inverts an output of the second OR gate OR2 to control a clean state of the third flip-flop F/F3.

The fifth inverter IN5 inverts (the synchronization load signal LD-N1) an output signal from the output terminal Q of the third flip-flop F/F3 to output the inverted output signal to a load terminal Load of the P/S converter 322.

Here, an operation of the synchronization load signal generator 3232 will be described below in relation to FIGS. 5 to 8.

Furthermore, the first flip-flop F/F1 to the third flip-flop F/F3 may be D-type flip-flips. Also, the first delay DL1 to the third delay DL3 may not be necessary, when the minimum time for loading the load signal DL-1 and the synchronization load signal DL-N1 is guaranteed.

The switch block 324 may include a first switch 3241, a second switch 3242, and a third switch 3243.

The first switch 3241 is connected to an output terminal of the P/S converter 322. Accordingly, previously output synchronized serial digital signals are input to the P/S converter 322 during a turned-on operation of the first switch 3241 by a first switch control signal.

When the signals, which are previously output from the P/S converter 322 by using the first switch 3241, are transferred to the computer 500, the computer 500 does not need to perform any further operations. Namely, the computer 500 processes the previously output signals as normal data.

The second switch 3242 is connected to an ON voltage (as an example, 5V) output from an ON voltage generator, etc. The ON voltage is input to the P/S converter 322 through the second switch 3242 during a turned-on operation by a second switch control signal.

The third switch 3242 is connected to an OFF voltage (as an example, 0V (GND)) output from an OFF voltage generator, etc. The OFF voltage is input to the P/S converter 322 through the third switch 3243 during a turned-on operation by a third switch control signal.

Here, when the signals (signals having all digital '1's, or all digital '0's) output to the P/S converter 322 by using the second and third switches 3242 and 3243 are transferred to the computer 500, the computer 500 may determine them to be an error signal and performs data analysis through deletion or compensation in software.

One or more of the first to third switches 3241 to 3143 may be included and operate in response to respective switch control signals (the first to third switch control signals) generated by a control device involved therein.

Figure 5:
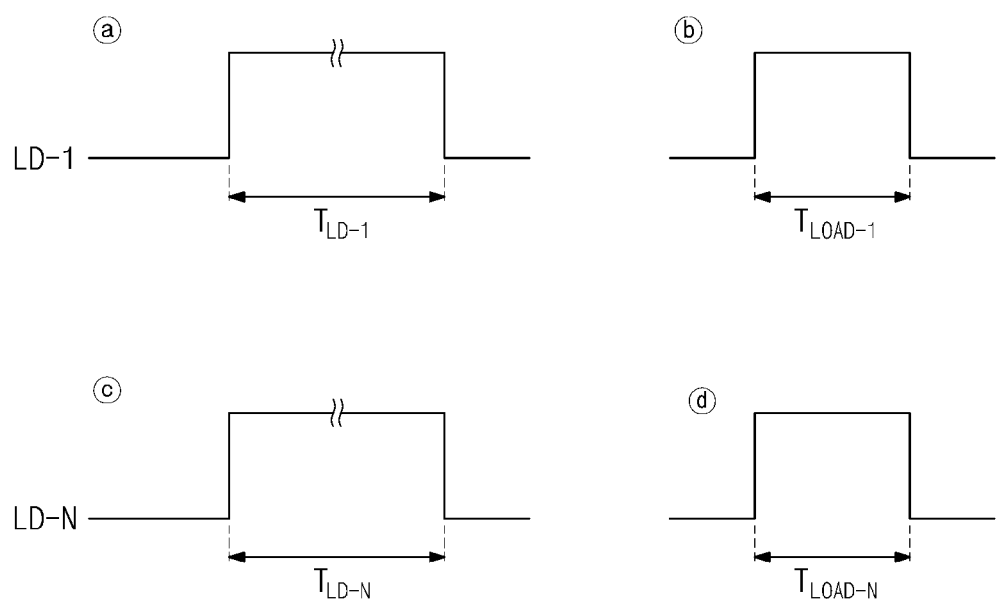
FIG. 5 illustrates exemplary pulse widths of a load signal and a reference load signal output from a synchronization load block according to the present invention.

FIG. 5 illustrates a pulse width of the load signal and the reference load signal generated by the synchronization load block 323.

In FIG. 5(a), the load signal LD-1 is shown.

In FIG. 5(b), a load signal LD-1 having a pulse width adjusted by the first delay DL1 in the synchronization load block 323 is shown.

In FIG. 5(c), the reference load signal LD-N is shown.

In FIG. 5(d), a reference load signal LD-N having a pulse width adjusted by the second delay DL2 in the load signal processing block 3231 is shown Hereinafter, the synchronization load block 323 will be described in relation to FIGS. 6 to 8.

Figure 6:
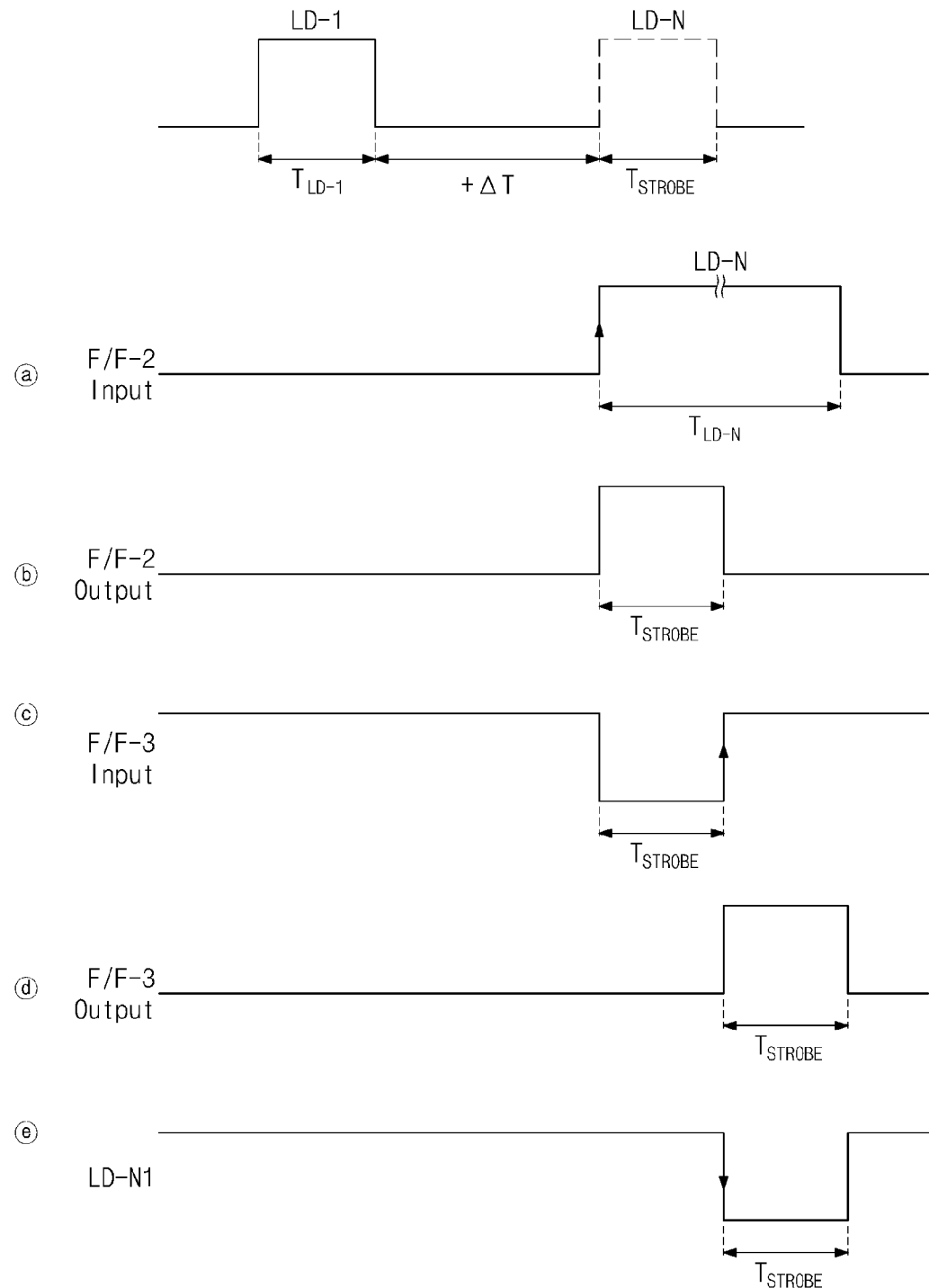
FIG. 6 is a signal flow chart illustrating output signals of the synchronization load block when the load signal and the reference load signal do not overlap according to the present invention.

FIG. 6 illustrates exemplary signal flowchart of output signals of the synchronization load block 323, when the load signal and the reference load signal do not overlap, according to the present invention.

Referring to FIG. 6, there is a time interval+ΔT, when the reference load signal LD-N is generated after generation of the load signal LD-1. Namely, the load signal LD-1 and the reference load signal LD-N do not overlap.

FIGS. 6(a) and 6(b) are respectively an input signal and an output signal of the second flip-flop F/F2.

The second flip-flop F/F2 receives the reference load signal LD-N. When the reference load signal LD-N changes from an OFF voltage to an ON voltage, the second flip-flop F/F2 outputs the ON voltage input though the input terminal D to the second delay DL2.

The second delay DL2 delays the ON voltage of the second flip-flop F/F2 for a predetermined time, and then outputs the delayed ON voltage to the first OR gate OR1.

The first OR gate OR1 outputs the ON voltage to the second inverter IN2.

The second inverter IN2 inverts the ON voltage to allow the second flip-flop F/F2 to be in a clean state. Accordingly, a signal having an adjusted pulse width is output through the second flip-flop F/F2.

FIGS. 6(c) and 6(d) are respectively input and output signals of the third flip-flop F/F3.

The output signal of the third flip-flop F/F2 is output to the third inverter IN3. An inverted signal by the third inverter IN3 is input to the third flip-flop F/F3.

The third flip-flop F/F3 operates at a time (shown as an arrow in FIG. 6(c)) when the output signal of the second flip-flop F/F2 changes from an OFF voltage to an ON voltage. The third flip-flop F/F3 outputs an ON voltage, which is input through the input terminal D by a rising voltage signal (shown as an arrow in FIG. 6(c)), through the third flip-flop F/F3.

The third delay DL3 delays an output signal of the ON voltage from the third flip-flop F/F3 to output it to the second OR gate OR2.

The second OR gate OR2 outputs an ON voltage to the fourth inverter IN4 in response to an output signal of the ON voltage.

The fourth inverter IN4 inverts the ON voltage to allow the third flip-flop F/F3 to be in a clean state. Accordingly, a signal having an adjusted pulse width is output through the third flip-flop F/F3.

As an example, the second delay DL2 and the third delay DL3 may have the minimum time for performing conversion into parallel digital signals of the S/P converter 321. Also, the second time delay DL2 and the third delay DL3 may have an identical time delay.

FIG. 6(e) is the synchronization load signal LD-N1.

The fifth inverter IN5 inverts an output signal of an ON voltage from the third flip-flop F/F3 to generate the synchronization load signal LD-N1.

Here, the fifth inverter IN5 may be included when the P/S converter 322 requires for a falling voltage signal. If the P/S converter 322 requires for a riding voltage signal, the fifth inverter IN5 is not included in the synchronization load signal generator 3232.

That is, the plurality of the signal conversion modules 320-1, . . . , and 320-16 in the present invention have an identical structure, and generate the synchronization load signals LD-N1, . . . , and LD-N16 at an identical time by using the reference load signal LD-N. Accordingly, the synchronized serial data signals output to the multiplexer 330 may obtain synchronization.

Figure 7:
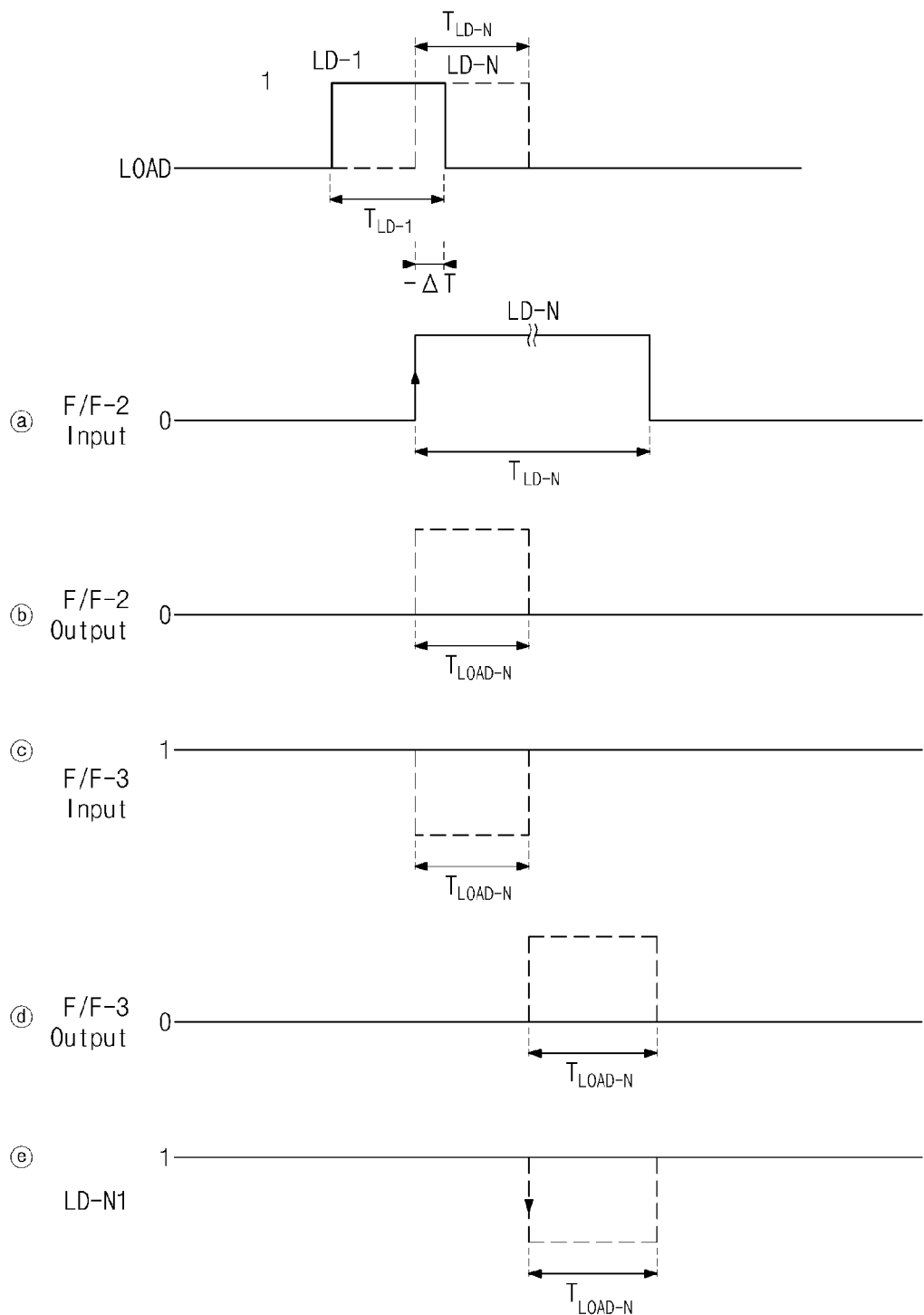
FIG. 7 is a signal flow chart illustrating exemplary output signals of the synchronization load block when the load signal and the reference load signal overlap according to the present invention.

FIG. 7 illustrates exemplary signal flowchart of output signals of the synchronization load block 323, when the load signal and the reference load signal overlap each other, according to the present invention.

Referring FIG. 7, there is a time interval−ΔT, when the reference load signal LD-N is generated after generation of the load signal LD-1. Namely, the load signal LD-1 and the reference load signal LD-N overlap each other.

FIGS. 7(a) and 7(b) are respectively an input signal and an output signal of the second flip-flop F/F2.

The second flip-flop F/F2 receives the reference load signal LD-N. When the reference load signal LD-N changes from an OFF voltage to an ON voltage, the second flip-flop F/F2 does not output the ON voltage input though the input terminal D.

This is because an ON voltage is input to the first OR gate OR1 due to an output of a load signal input to the first flip-flop F/F1. At this time, the first OR gate OR 1 outputs the ON voltage to the second inverter IN2. The second inverter IN2 inverts the ON voltage to output it to the second inverter IN2. The second inverter IN2 inverts the ON voltage to allow the second flip-flop F/F2 to be in a clean state. Accordingly, since the second flip-flop F/F2 does not operate, the ON voltage input through the input terminal D is not output.

That is, since there is no an output signal of the second flip-flop F/F2, the output signal of the second flip-flop F/F2 is represented as a dashed line.

The second flip-flop F/F2 outputs an OFF voltage to the second delay DL2 and maintains an OFF state.

FIGS. 7(c) and 7(d) are respectively input and output signals of the third flip-flop F/F3.

An output signal of the second flip-flop F/F2 is output to the third inverter IN3. An ON signal inverted by the third inverter IN3 is input to the third flip-flop F/F3.

However, the third flip-flop F/F3 does not operate, since the output signal from the second flip-flop F/F2 does not change.

In addition, an ON voltage is input to the OR gate OR2 due to an output of the load signal LD-1 which is input to the first flip-flop F/F1. Accordingly, the second OR gate OR2 outputs an ON voltage to the fourth inverter IN4. Since the fourth inverter IN4 inverts the ON voltage to allow the third flip-flop F/F3 to be in a clean state, the third flip-flop F/F3 does not operate.

Accordingly, the third flip-flop F/F3 outputs an OFF voltage.

FIG. 7(e) is a synchronization load signal LD-N1.

The fifth inverter IN5 inverts an output signal of the OFF voltage from the third flip-flop F/F3 to generate the synchronization load signal LD-N1. That is, the synchronization load signal LD-N1 maintains an ON voltage due to OFF states of the second flip-flop F/F2 and the third flip-flop F/F3.

Accordingly, the P/S converter 322 which receives the synchronization load signal LD-N1 of an ON voltage does not convert the input parallel digital signals into synchronized serial digital signals.

Figure 8:
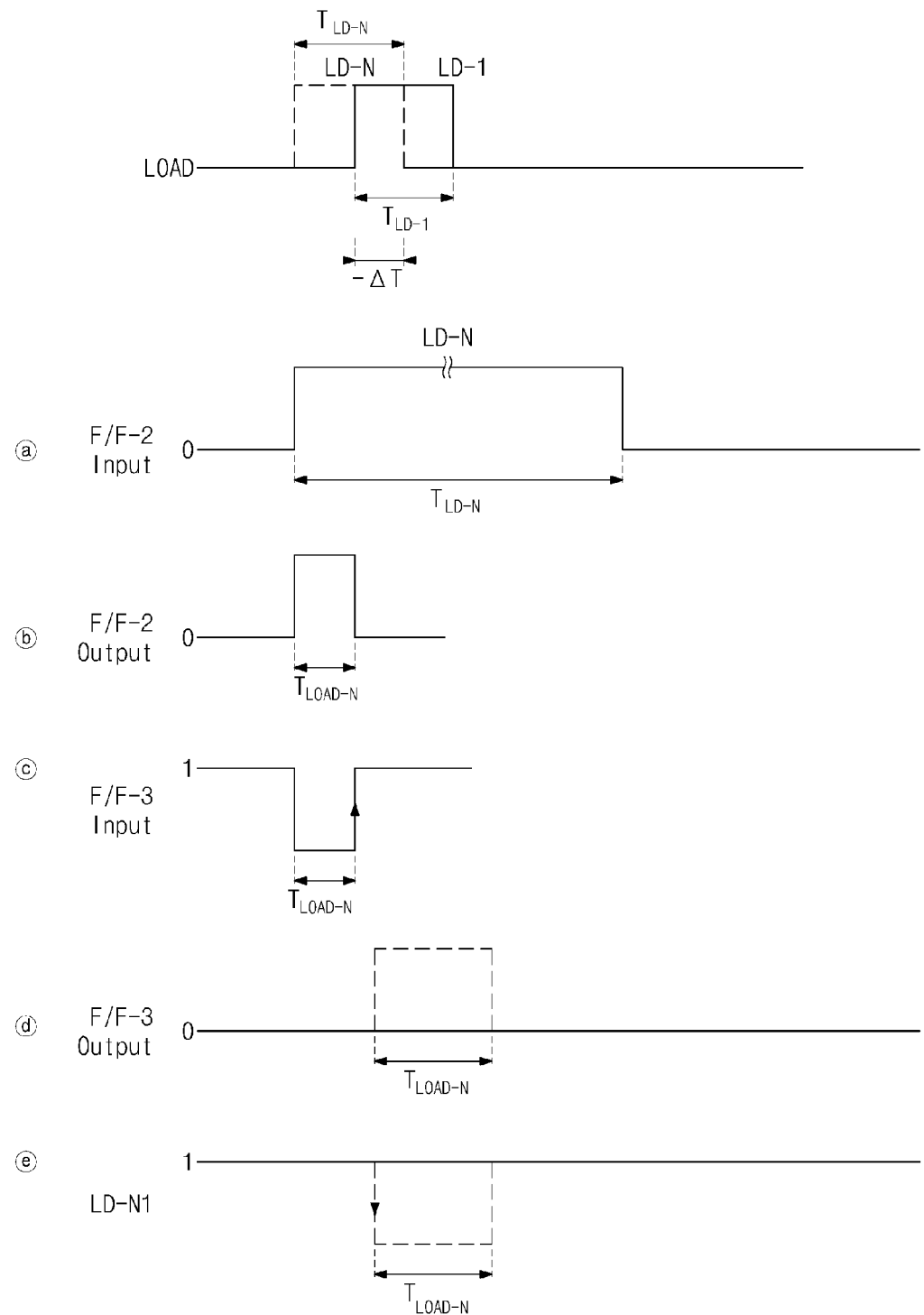
FIG. 8 is a signal flow chart illustrating exemplary output signals of the synchronization load block when the load signal and the reference load signal overlap according to the present invention.

FIG. 8 is an exemplary signal flow chart illustrating output signals of the synchronization load block when the reference load signal and the load signal overlap according to the present invention.

Referring to FIG. 8, there is a time interval–ΔT, when the load signal LD-1 is generated after generation of the reference load signal LD-N. Namely, the load signal LD-1 and the reference load signal LD-N overlap each other.

FIGS. 8(*a*) and 8(*b*) are respectively an input signal and an output signal of the second flip-flop F/F2.

The second flip-flop F/F2 receives the reference load signal LD-N. The reference load signal LD-N changes from an OFF voltage to an ON voltage, the second flip-flop F/F2 outputs the ON voltage which is input though the input terminal D. The second delay DL2 delays an ON voltage of the second flip-flop F/F2 for a predetermined time to output the delayed ON voltage to the first OR gate OR1.

However, the ON voltage output from the first flip-flop F/F1 which operates with the load signal LD-1 is input to the first OR gate OR1.

The first OR gate OR1 outputs an ON voltage to the second inverter IN2.

The second inverter IN2 inverts the ON voltage to allow the second flip-flop F/F2 to be in a clean state. Accordingly, the second flip-flop F/F2 generates a signal having a shorter pulse width than the minimum time for loading the P/S converter 322.

FIGS. 8(*c*) and 7(*d*) are respectively input and output signals of the third flip-flop F/F3.

An output signal of the second flip-flop F/F2 is output to the third inverter IN3. An ON voltage inverted by the third inverter IN3 is input to the third flip-flop F/F3.

When an output signal of the second flip-flop F/F2 changes from an OFF voltage to an ON voltage (represented as an arrow in FIG. 8(*c*)), the third flip-flop F/F3 operates.

However, an ON voltage is input to the second OR gate OR2 due to an output of the load signal LD1 which is input to the first flip-flop F/F1. Accordingly, the second OR gate OR2 outputs an ON voltage to the fourth inverter IN4. Since the fourth inverter IN4 inverts an ON voltage to allow the third flip-flop F/F3 to be in a clean state, the third flip-flop F/F3 does not operate.

Accordingly, the third flip-flop F/F3 outputs an OFF voltage.

FIG. 8(*e*) is a synchronization load signal LD-N1.

The fifth inverter IN5 inverts an output signal of the OFF voltage from the third flip-flop F/F3 to generate the synchronization load signal LD-N1. That is, the synchronization load signal LD-N1 maintains an ON voltage due to an OFF state of the third flip-flop F/F3.

Accordingly, the P/S converter 322, which receives the ON voltage of the synchronization load signal LD-N1, does not convert the input parallel digital signals into synchronized serial digital signals.

As described above, when the P/S converter 322 does not perform signal conversion into the synchronized serial digital signals as shown in FIGS. 7 and 8, a switch control signal for operating one of the switches 3241, 3242 and 3243 in the switch block 324 may be generated in a control circuit (not shown).

A data synchronization apparatus proposed in the present invention may be used for converting individual serial digital signals received through a plurality of channels or optical lines into synchronized serial digital signals in medical diagnosing equipment utilizing SQUID sensors such as a magnetic shielded room.

Since controlling a generation operation of a load signal between the S/P converter and the P/S converter, the data synchronization apparatus of the present invention can prevent imperfect conversion from occurring when individual serial digital signals are converted into synchronized serial digital signals. Also, the data synchronization apparatus can reduce a time taken to process imperfect data, generated when obtaining the synchronized serial digital signals, and does not create data errors.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data synchronization apparatus comprising:
    a signal conversion block configured to convert individual serial digital signals into parallel digital signals in response to a load signal, and to convert the parallel digital signals into synchronized serial digital signals in response to a synchronization load signal, the synchronization load signal being a signal which does not overlap the load signal;
    a clock/load signal generator configured to output a reference load signal to the signal conversion block, the signal conversion block using the reference load signal to generate the synchronization load signal;
    a multiplexer configured to multiplex the synchronized serial digital signals; and
    a first serial-to-parallel (S/P) converter configured to convert the multiplexed synchronized serial digital signals into parallel signals.

2. The data synchronization apparatus of claim 1, wherein the signal conversion block comprises:
    a second S/P converter configured to convert the individual serial digital signals into the parallel digital signals in response to the load signal;
    a synchronization load block configured to generate the synchronization load signal in response to the reference load signal such that the synchronization load signal does not overlap the load signal;
    a parallel-to-serial (P/S) converter configured to convert the parallel digital signals into the synchronized digital signals in response to the synchronization load signal; and
    a switch block configured to control an output of the P/S converter for compensating for data signals, the data signals being signals which are not converted by the P/S converter into the synchronized serial digital signals.

3. The data synchronization apparatus of claim 2, wherein the synchronization load block comprises:
    a load signal processing block configured to generate a first output signal based on a minimum load time of the S/P converter and the load signal; and
    a synchronization load signal generating block configured to selectively output the synchronization load signal such that the synchronization load signal maintains a same logic level when the first output signal is enabled.

4. The data synchronization apparatus of claim 3, wherein the load signal processing block comprises:
    a first flip-flop having an input terminal configured to receive an ON voltage, a clock terminal configured to receive the load signal, and a clear terminal configured to reset the first flip-flop, the first flip-flop configured to generate the first output signal in response to the load signal;

a first inverter configured to invert the first output signal; and a first delay element configured to delay the inverted first output signal for a time to generate a first delay signal, and to output the first delay signal to the clear terminal of the first flip-flop.

5. The data synchronization apparatus of claim 4, wherein the synchronization load signal generating block comprises:

a second flip-flop having an input terminal configured to receive an ON voltage, a clock terminal configured to receive the reference load signal, and a clear terminal configured to reset the second flip-flop, the second flip-flop configured to generate a second output signal in response to the reference load signal;

a second delay element configured to delay the second output signal for a minimum load time of the P/S converter to generate a second delay signal;

a first OR gate performing a logical sum on the first output signal and the second delay signal;

a second inverter configured to invert an output of the first OR gate, and to output the inverted result to the clear terminal of the second flip-flop;

a third inverter configured to invert the second output signal to generate an inverted second output signal;

a third flip-flop having an input terminal configured to receive an ON voltage, a clock terminal configured to receive the inverted second output signal, and a clear terminal configured to reset the third flip-flop, the third flip-flop configured to generate a third output signal in response to the inverted second output signal;

a third delay element configured to delay the third output signal for the minimum load time of the P/S converter to output a third delay signal;

a second OR gate performing a logical sum on the first output signal and the third delay signal;

a fourth inverter configured to invert an output of the second OR gate to output the inverted result to the clear terminal of the third flip-flop; and a fifth inverter configured to invert the third output signal to generate the synchronization load signal.

6. The data synchronization apparatus of claim 2, wherein the switch block comprises:

a first switch connected to a ON voltage, the first switch configured to provide the ON voltage to an input of the P/S converter in response to a first switch control signal;

a second switch connected to a OFF voltage, the second switch configured to provide the OFF voltage to the input of the P/S converter in response to a second switch control signal; and a third switch connected to an output terminal of the P/S converter, the third switch configured to provide previously output serial digital signals to an input of the P/S converter in response to a third switch control signal.

7. A data synchronization apparatus comprising:

a first S/P converter configured to convert serial digital signals into parallel digital signals in response to a load signal;

a synchronization load block configured to generate a synchronization load signal based on a reference load signal such that the synchronization load signal does not overlap the load signal;

a P/S converter configured to convert the parallel digital signals into synchronized serial digital signals in response to the synchronization load signal; and a switch block configured to control the P/S converter for compensating for data signals, the data signals being signals which are not converted by the P/S converter into the synchronized serial digital signals.

8. The data synchronization apparatus of claim 7, further comprising:

a multiplexer configured to multiplex the synchronized serial digital signals output and converted by the P/S converter; and a second S/P converter configured to convert the multiplexed signal into parallel digital signals.

9. The data synchronization apparatus of claim 7, further comprising:

a clock/load generator configured to generate the reference load signal, and to output the reference load signal to the synchronization load block.

10. The data synchronization apparatus of claim 7, wherein the synchronization load block comprises:

a load signal processing block configured to generate a first output signal based on a minimum load time of the first S/P converter and the load signal; and a synchronization load signal generating block configured to selectively output the synchronization load signal such that the synchronization load signal maintains a same logic level when the first output signal is enabled.

11. The data synchronization apparatus of claim 10, wherein the load signal processing block comprises:

a first flip-flop having an input terminal configured to receive an ON voltage, a clock terminal configured to receive the load signal, and a clear terminal configured to reset the first flip-flop, the first flip-flop configured to generate the first output signal in response to the load signal;

a first inverter configured to invert the first output signal; and a first delay element configured to delay the inverted first output signal for the minimum load time of the first S/P converter to generate a first delay signal, and to output the first delay signal to the clear terminal of the first flip-flop.

12. The data synchronization apparatus of claim 11, wherein the synchronization load signal generating block comprises:

a second flip-flop having an input terminal configured to receive an ON voltage, a clock terminal configured to receive the reference load signal, and a clear terminal configured to reset the second flip-flop, the second flip-flop configured to generate a second output signal in response to the reference load signal;

a second delay element configured to delay the second output signal for a minimum load time of the P/S converter to generate a second delay signal;

a first OR gate performing a logical sum on the first output signal and the second delay signal;

a second inverter configured to invert an output of the first OR gate, and to output the inverted result to the clear terminal of the second flip-flop;

a third inverter configured to invert the second output signal to generate an inverted second output signal;

a third flip-flop having an input terminal configured to receive an ON voltage, a clock terminal configured to receive the inverted second output signal, and a clear terminal configured to reset the third flip-flop, the third flip-flop configured to generate a third output signal in response to the inverted second output signal;

a third delay element configured to delay the third output signal for the minimum load time of the P/S converter to output a third delay signal;

a second OR gate performing a logical sum on the first output signal and the third delay signal;

a fourth inverter configured to invert an output of the second OR gate to output the inverted result to the clear terminal of the third flip-flop; and a fifth inverter configured to invert the third output signal to generate the synchronization load signal.

13. The data synchronization apparatus of claim 7, wherein the switch block comprises at least one of:

a first switch connected to a ON voltage, the first switch configured to provide the ON voltage to an input of the P/S converter in response to a first switch control signal;

a second switch connected to a OFF voltage, the second switch configured to provide the OFF voltage to the input of the P/S converter in response to a second switch control signal; and a third switch connected to an output terminal of the P/S converter, the third switch configured to provide previously output serial digital signals to an input of the P/S converter in response to a third switch control signal.

\* \* \* \* \*